United States Patent
Katoh et al.

(10) Patent No.: US 6,360,813 B1
(45) Date of Patent: Mar. 26, 2002

(54) ELECTRONIC COMPONENTS COOLING APPARATUS

(75) Inventors: Takahiro Katoh; Kiyoo Amako, both of Kawasaki (JP)

(73) Assignee: TS Heatronics Co., Ltd., Tokyo (JP)

( * ) Notice: Subject to any disclaimer, the term of this patent is extended or adjusted under 35 U.S.C. 154(b) by 0 days.

(21) Appl. No.: 09/574,484

(22) Filed: May 19, 2000

(30) Foreign Application Priority Data

May 20, 1999 (JP) .......................................... 11-139606
May 26, 1999 (JP) .......................................... 11-146867

(51) Int. Cl.⁷ ............................................. F28D 15/00
(52) U.S. Cl. ................ 165/104.33; 165/185; 165/80.4; 361/700; 174/15.2
(58) Field of Search .......................... 165/80.4, 104.26, 165/104.33; 361/699, 700; 174/15.1, 15.2

(56) References Cited

U.S. PATENT DOCUMENTS

| | | | | |
|---|---|---|---|---|
| 4,449,576 A | * | 5/1984 | Baum et al. ........... | 165/104.33 |
| 4,616,699 A | | 10/1986 | Grote | |
| 4,793,405 A | * | 12/1988 | Diggelmann et al. .. | 165/104.33 |
| 5,219,020 A | | 6/1993 | Akachi | |
| 5,283,715 A | * | 2/1994 | Carlsten et al. ........ | 165/104.33 |
| 5,343,940 A | * | 9/1994 | Jean ...................... | 165/104.33 |
| 5,507,092 A | | 4/1996 | Akachi | |
| 5,697,428 A | | 12/1997 | Akachi | |
| 5,737,840 A | | 4/1998 | Akachi | |
| 6,104,611 A | * | 8/2000 | Glover et al. ............... | 361/700 |
| 6,115,251 A | * | 9/2000 | Patel et al. ................. | 165/80.4 |

FOREIGN PATENT DOCUMENTS

| | | |
|---|---|---|
| EP | 0739647 | 10/1996 |
| EP | 0753713 | 1/1997 |
| EP | 0863696 | 9/1998 |
| FR | 2682746 | 4/1993 |
| JP | 04-190090 | 7/1992 |
| JP | 05-315482 | 11/1993 |
| JP | 07-063487 | 3/1995 |
| JP | 09-049692 | 2/1997 |

OTHER PUBLICATIONS

Patent Abstracts of Japan, vol. 1995, No. 11, Dec. 26, 1995 and JP 07–211826 A (Toyo Electric Mfg. Co. Ltd.), Aug. 11, 1995—Abstract.

* cited by examiner

Primary Examiner—Ira S. Lazarus
Assistant Examiner—Terrell McKinnon
(74) Attorney, Agent, or Firm—Frishauf, Holtz, Goodman, Langer & Chick, P.C.

(57) ABSTRACT

An electronic component cooling apparatus includes an air-cooled or water-cooled heat radiating portion and a meandering capillary tube heat pipe which carry out heat transfer between a board having electronic components mounted thereon and the heat radiating portion. The heat radiating portion comprises a plate fin type radiator 21 with an outer-shape of a substantially flat plate. The meandering capillary tube heat pipe is a plate type heat pipe 13 with an outer-shape of a substantially flat plate. The meandering capillary 13c is connected along a surface of the heat radiating portion. Since the meandering capillary tube heat pipe has a very large heat transfer capacity and is able to transfer heat over a long distance with low thermal resistance, it is possible to separate the board apart from the heat radiating portion. Accordingly, flexibility in arrangement of the electronic components or the heat radiating portion is so improved that various shaped apparatus can be designed and manufactured.

13 Claims, 8 Drawing Sheets

ELECTRONIC COMPONENTS COOLING APPARATUS

TECHNICAL FIELD

The present invention relates to a cooling apparatus for electronic components, such as a transistor for a power supply circuit. Particularly, it relates to an electronic component cooling system which has sufficient coolability, even when a heat radiating portion having a plate fin type radiator is spaced apart from the electronic component, and has high flexibility in design.

BACKGROUND OF THE INVENTION

Recently, the integration and installation density of electronic components have been increasingly higher. Accordingly improvement in cooling efficiency of the electronic components has become more important. Especially, so called power ICs, such as an IGBT (Insulated Gate type Bipolar Transistor), are not only used for signal transfer but also for supplying drive power to other components, so that they produce a large amount of heat. Thus, it is difficult to cool them.

FIG. 10 is a schematic perspective view of a conventional air-cooled electronic components cooling apparatus 501.

In this conventional example, four printed boards 519 having electronic components mounted thereon (Integrated Circuits and the like, not shown) are arranged in parallel. At each top and bottom end of the boards 519, a plate-fin type radiator 5 (a heat radiating portion) 511, 515 is disposed. Each of the plate-fin type radiators 511, 515 has honeycomb shaped vent holes 511a and 515a, through which air flows in the arrow direction in FIG. 10. Most of the heat produced by the elements on the boards 519 is transferred through the boards 519 and then to the plate-fin type radiators 511, 515 and finally to be radiated into the outside air. In order to improve the heat conduction through the boards 519, an aluminum plate (not shown) may be embedded in the boards.

In the conventional electronic component cooling apparatus shown in FIG. 10, the plate-fin type radiator 511,515 has to be disposed around the boards 519 and in contact with the boards 519. So, flexibility in design is poor, and because of the large volume of the plate-fin type radiator 511, 515, the whole apparatus becomes bulky.

When improvement in the coolability is required, in a case where the size of the whole apparatus is limited, it is necessary to increase the air flow (enlarging the size of a fun or increasing the rotation speed of the fun, or the like). That is because, in most cases, there is little probability to decrease the temperature at the radiator inlet portion, and there is a limit in improving the efficiency of the radiator itself. Under the condition where it is impossible to increase the air flow, the volume or size of the radiator has to be increased to enlarge the whole apparatus volume. Thus, in the above case, design flexibility is poor.

FIG. 11 is a schematic side-sectional view of a conventional water-cooled electronic component cooling apparatus 401.

In this conventional example, a water-cooled heat exchanger 611 is disposed around boards 619. In the water-cooled heat exchanger 611, a honeycomb shaped water conduit 611a is formed within which a cooling water (coolant) flows.

The water-cooled electronic component cooling apparatus shown in FIG. 11 has large a heat transfer capacity and has a higher coolability than the air-cooled apparatus shown in FIG. 10. However, the water-cooled electronic component cooling apparatus of FIG. 11 requires a water-cooling facility, such as a circulation pipe line for cooling water, a heat exchanger, and the like. So, since the apparatus becomes large and complicated and the system configuration requires more elements than the air-cooled type, the whole facility of the water-cooling system becomes complicated.

And, when improvement in coolability is required, in a case where the size of the whole apparatus is limited, it is necessary to increase the water flow (enlarging the size of a pump or increasing the rotation speed of the pump, or the like). This is because, in most cases, there is little probability to decrease the temperature at the radiator inlet portion, and there is a limit in improving the efficiency of the radiator itself. Under the condition where it is impossible to increase the water flow, the volume of the radiator has to be increased to thereby enlarge the whole apparatus. Thus, like the air-cooled type, design flexibility is also poor.

In view of the above problems, the object of the present invention is to provide an electronic component cooling apparatus which has sufficient coolability even when the heat radiating portion having a plate-fin type radiator is spaced apart from an electronic component, and which has high design flexibility.

SUMMARY OF THE INVENTION

In order to solve the above-mentioned problems, a cooling apparatus according to the present invention, for cooling an electronic component or boards on which the electronic component is mounted, comprises an air-cooled or water-cooled heat radiating portion and a meandering capillary tube heat pipe arranged to transfer heat between the above-mentioned electronic component or the board and the heat radiating portion.

Meandering capillary tube heat pipes have a very large heat transfer capability and are able to transfer heat along a long distance with a low thermal resistance. Therefore, even when the distance between the heat radiating portion and the electronic component or the board on which the electronic component is mounted becomes long, the temperature rise of the electronic component and the like can be suppressed. Therefore, it is possible to separate the board apart from the heat radiating portion, thus improving flexibility in arrangement of the electronic component or the heat radiating portion, so that various shaped apparatus can be designed and manufactured. And, a higher-density mounting of electronic components (Integrated Circuits and the like) is achieved and thus miniaturization of the apparatus is achieved.

In this specification, the term meandering capillary tube heat pipe means a heat pipe which has the following characteristics (disclosed in Japanese Laid-open Patent Publication No. Hei 4 (1992)-190090(U.S. Pat. No. 5,219,020 (Jun. 15,1993)), the entire contents of which are incorporated herein by reference).

(1) The meandering capillary tube heat pipe comprises a capillary that is sealed off from the outside.
(2) One part of the capillary acts as a heat radiating portion, and another part acts as a heat receiving portion.
(3) The heat receiving portion and the heat radiating portion are alternately arranged, and between them the capillary meanders.
(4) In the capillary, a two-phase condensable working fluid is sealed.
(5) The capillary has a diameter less than a maximum diameter which allows the two-phase condensable working fluid to circulate and move while being sealed inside of the capillary.

Examples of this type of meandering capillary tube heat pipe are disclosed in Japanese Laid-open Patent Publication No. Hei 4 (1992)-190090 (U.S. Pat. No. 5,219,020 (Jun. 15,1993)), No. Hei 7 (1995)-63487 (U.S. Pat. No. 5,697,428 (Dec. 16,1997)) and No. Hei 9 (1997)-49692 (U.S. Pat. No. 5,737,840 (Apr. 14, 1998)). Among them, in the latter two Japanese Patent Publications, the meandering capillary is embedded in a comparatively thin flat plate (thus called a plate-type heat pipe). If such a plate type heat pipe is adapted, it is easy to design and assemble connecting portions with a board and a heat radiating portion (a plate-fin type radiator and the like). The plate type heat pipe disclosed in Japanese Laid-open Patent Publication No. Hei 9 (1997)-49692(U.S. Pat. No. 5,737,840 (Apr. 14,1998)) uses, as a material, an aluminum extruded material which has many small channels, thereby reducing the material cost and machining cost.

In the electronic component cooling apparatus according to the present invention, it is preferable that the heat radiating portion comprises a set of radiation fins with an outer-shape of a substantially flat plate (plate fin type radiator)and the meandering capillary tube heat pipe comprises a plate type heat pipe with an outer-shape of a substantially flat plate and connected along the heat radiating portion.

Since the meandering capillary tube heat pipe is connected along the heat radiating portion, a wide contact area between the heat pipe and the heat radiating portion may be retained to reduce the thermal resistance through the contacting portion between them.

Instead of the plate fin type radiator, a hedgehog-type heat sink made by TS Heatronics Co., Ltd. (Japanese Laid-open Patent Publication No. Hei 5 (1993)-315482 (U.S. Pat. No. 5,507,092 (Apr. 16,1996))) may be used.

The electronic component cooling apparatus according to an aspect of the present invention, for cooling a plurality of boards on which electronic components are mounted, the boards being arranged in a row, comprises a plate fin type air-cooled or water-cooled radiator and a plate type meandering capillary tube heat pipe that transfers heat between an end face of the boards and the heat radiator. The meandering capillary tube heat pipe has one part constituting a sidewall of the electric component cooling apparatus and another part bent at the end of the sidewall and connected along the heat radiating portion.

According to this aspect of the electronic component cooling apparatus, even when the electronic component mounting board is spaced apart from the heat radiating portion, a temperature rise of the electronic component can be prevented. Thus it is possible to sufficiently cool the electronic components while improving the installation density of the electronic components.

In the electronic component cooling apparatus according to the present invention, it is preferable that the thermal resistance at the connecting portion (contacting face) between the heat radiating portion and the meandering capillary tube heat pipe is between 0.001° C./W and 3.00° C./W, and the heat flux of the same is between 0.01 W/cm$^2$ and 30 W/cm$^2$.

In this range, while the temperature rise at the connecting portion between the heat pipe and the heat radiating portion is suppressed under a certain temperature, sufficient heat transfer can be achieved. The range of the thermal resistance on the same area is more preferably between 0.01° C./W and 0.5° C./W, and the range of the heat flux of the same area is preferably between 0.01 W/cm$^2$ and 10 W/cm$^2$.

In the electronic component cooling apparatus according to the present invention, it is preferable that the thermal resistance at the contacted portion between the end face of the board and the meandering capillary tube heat pipe is between 0.001° C./W and 3.00° C./W, and the heat flux of the same is between 0.01 W/cm$^2$ and 30 W/cm$^2$.

In this range, while the temperature rise at the contacting portion between the end face of the board and the meandering capillary tube heat pipe is suppressed under a certain temperature, sufficient heat transfer can be achieved. The range of the thermal resistance on the same portion is preferably between 0.01° C./W and 0.5° C./W, and the heat flux of the same portion is preferably between 0.01 W/cm$^2$ and 10 W/cm$^2$.

In an electronic component cooling apparatus according to the present invention, a bracket is preferably provided which secures the board between the end face of the board and the meandering capillary tube heat pipe. The bracket is preferably secured to the heat pipe by solder and/or a screw.

When the board is mounted to the heat pipe firmly, the heat transfer from the board to the heat pipe is improved.

In an electronic component cooling apparatus according to the present invention, it is preferable that the meandering capillary tube heat pipe is secured to the plate fin type radiator by a screw, and a screw-threaded hole (female screw thread) is formed in the plate-fin type radiator. The female screw thread is preferably formed in a lock insert which is installed to the radiator.

As a material used for these cooling apparatuses, aluminum (and alloys thereof), which has good heat transfer efficiency and machinability and is light, is preferably used. However, conventional aluminum is relatively soft and is easily damaged, when the female screw thread is formed into the aluminum. In such case, the screw thread can not be firmly tightened with another part. In such a case, the heat transfer between both parts is so poor as to produce a disadvantageous thermal resistance. To overcome this problem, the female screw thread is formed into a lock insert, which is inserted into the plate fin type radiator. Using this technique, the screw can be firmly tightened so that the meandering capillary tube heat pipe can be securely contacted with the plate fin type radiator, and disadvantageous high thermal resistance can be removed.

According to another aspect of the present invention, an electronic component cooling apparatus is provided with an air-cooled or water-cooled radiator and a meandering capillary tube heat pipe to carry out heat transfer between the board and the radiator. The meandering capillary tube heat pipe is attached along a surface of the board.

According to this aspect of the invention, the heat produced from the board is removed by the heat pipe, which is Just located reverse of the board, so that it does not need to transfer the heat for the long distance through the board, which thermal conductivity is generally low. Thus, this arrangement has good coolability.

BRIEF DESCRIPTION OF THE DRAWINGS

FIGS. 1(A) and 1(B) show an electronic component cooling apparatus according to one embodiment of the present invention, wherein FIG. 1(A) shows a perspective view of the whole apparatus, and FIG. 1(B) is an enlarged side sectional view showing details of a bracket and a heat pipe.

DETAILED DESCRIPTION OF EMBODIMENT OF THE INVENTION

Figure 1A:
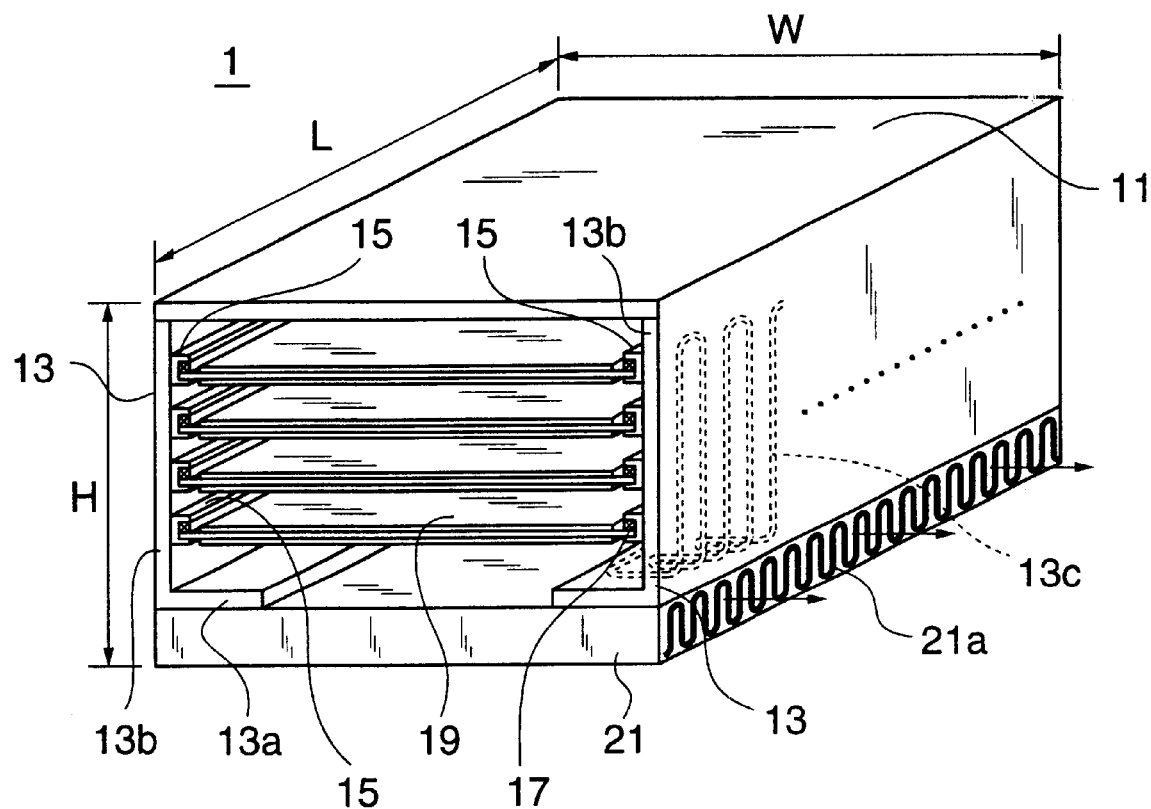
Figure 1B:
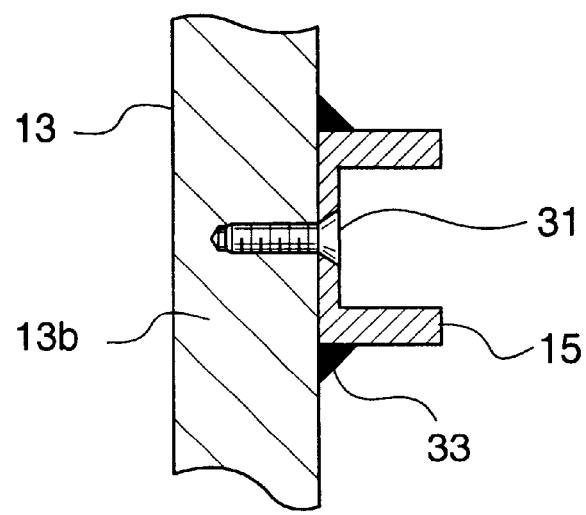

FIGS. 1(A) and 1(B) show an electronic component cooling apparatus according to one embodiment of the present invention. FIG. 1(A) shows a perspective view of the whole apparatus, and FIG. 1(B) is an enlarged side sectional view showing details of a bracket and a heat pipe.

The electronic component cooling apparatus 1 has a rectangular box shape as a whole, and mainly comprises a lid 11, a plate type heat pipe 13 and a plate fin type radiator 21. The height (H) direction of the embodiment of FIG. 1(A) is called the top and bottom direction, the width (W) direction is called the left and right direction, and the depth (L) direction is called the front and back direction.

The lid 11 is a flat plate made of aluminum or the like, and is bridged between the top ends of the heat pipe 13 (sidewalls 13b) shown on the left and right of FIG. 1(A). The lid 11 protects the inside of the apparatus.

The heat pipe 13 is part of the left and the right sidewalls of the electronic component cooling apparatus. The heat pipe 13 is a relatively thin flat plate made of aluminum and the like, in which a meandering capillary 13c which makes a loop is formed. In the meandering capillary 13c, a heating medium, such as Fleon (HCFC-123, HFC-134a, and the like), water and butane, is enclosed. The detailed embodiments like this plate type heat pipe are disclosed in Japanese Laid-open Patent Publication No. Hei 7 (1995)-63487(U.S. Pat. No. 5,697,428 (Dec. 16,1997)) and No. Hei 9 (1997)-49692(U.S. Pat. No. 5,737,840 (Apr. 14,1998)).

The heat pipe 13 has an L-shaped side shape. Thus, the heat pipe 13 has a side (sidewall 13b) which forms the sidewalls of the electric component cooling apparatus and a bottom (contacting portion 13a) which are contacted to the plate fin type radiator 21. The bottom face of each of the connecting portions 13a contacts the top face of the plate fin type radiator 21. The meandering capillary 13c is meandering through the sidewalls 13b and the connecting portions 13a to form a zigzag pattern between them.

Inside of the sidewall 13b of the heat pipe, as shown enlarged in FIG. 1(B), a bracket 15 is mounted. The bracket 15 is a part which is channel shaped in cross section, and which opens laterally. The bracket 15 is extended to the depth (L) direction, and the extended length thereof is almost the same as the dimension L.

The bracket 15 is secured to the heat pipe 13 by screw 31 and solder 33. The screw 31 is screwed to the heat pipe 13 through bottom face of the channel shaped bracket 15. The screw hole in the sidewall 13b is located away from the meandering capillary 13c. The solder 33 is attached to corners of both sides of the bracket 15. By such securing method, the proper locating of the bracket 15, and a high heat conduction, are ensured. The material of the solder 33, for example in the case of heat pipe base aluminum (A1100), is aluminum solder.

As shown in FIG. 1(A), inside the bracket 15, the end of the board 19 is inserted, and, on the end, a wedge clamp 17 is disposed. On the board 19, elements, such as power transistors and resistors and the like, are disposed. In FIG. 1(A), the four boards 19 are arranged in parallel to bridge between the left and right sidewalls 13b of the heat pipe.

The wedge clamp 17, which comprises a wedge and a screw that drives the wedge (both of them not shown), presses the end of the board 19 to the inside of the bracket 15. The wedge clamp 17 is generally used for these type of electronic component cooling apparatuses, for example Wedge-LOK made by EG&G Co. and the like is used.

When the board 19 is mounted, the wedge clamp 17 is loosened to insert the board 19 from the front to the back in FIG. 1(A). Then, the wedge clamp 17 is tightened to press the end of the board 19 to the inside of the bracket 15. By this, good heat conduction between the end of the board 19 and the bracket 15 can be ensured.

The plate fin type radiator (radiating portion) 21 has a plurality of honeycomb-shaped vent holes 21a located inside thereof. The vent holes 21a are extended in the left and right direction in FIG. 1(A), and open in the left and right end face. When air runs through the vent holes 21a, the electronic component cooling apparatus is cooled. The plate fin type radiator 21 generally uses, as a heat exchange fin, a thin sheet of aluminum (A3003 and the like) which is bent into a corrugated shape.

Figure 2:
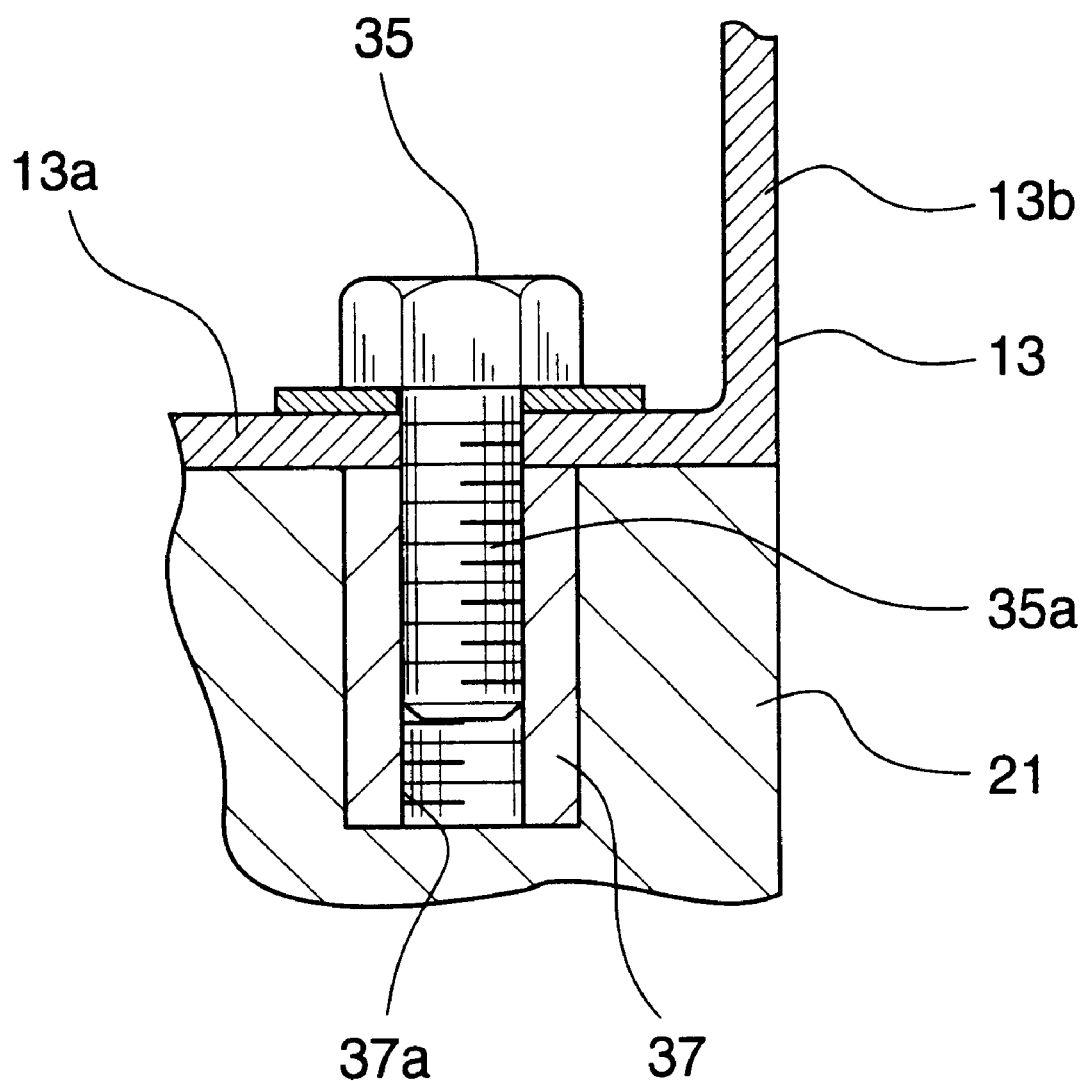
FIG. 2 is an enlarged front sectional view of the connecting portion of a plate fin type radiator with the heat pipe.

FIG. 2 is an enlarged front sectional view of the connecting portion between the plate fin type radiator 21 and the heat pipe. The contacting portion 13a, which is a bottom of the L-shaped heat pipe 13, is contacted with the top face of the heat exchanger 21. And, both of them are tightened together by a bolt 35.

A female screw thread 37a of the heat exchanger 21 is formed in a lock insert 37. The lock insert 37 is made of a relatively hard material, such as stainless steel and the like, and is a hollow cylindrical part with the female screw thread formed in the inside thereof. The lock insert 37 is secured in a hole of the heat exchanger 21 by the spring force of itself (interference fit) and the friction force with the male screw. By using the lock insert 37, the strength of the connection using the female screw thread 37a is improved so that the bolt 35 can be firmly tightened. As a result, the contact between the heat pipe contacting portion 13a and the heat exchanger 21 becomes so tight as to be able to decrease the thermal resistance between them. And, between the heat pipe contacting portion 13a and the top face of the heat exchanger 21, a high heat conduction grease (for example, STYCAST910-50-40 made by Emerson & Cuming Co.) or a high heat conduction sheet (for example, THERMAT-TACH TAPE made by Comerics Co.) can be also provided. Or, a high heat conduction gel (for example, Si gel made by SUZUKI SOUGYOU) can be also used so that, by removing an air space in the heat exchanger surface of the contacting portion, the salability can be improved.

In the electronic component cooling apparatus shown in FIGS. 1(A) and 1(B), the heat produced from the element (not shown) on the board 19 is transferred to the board 19, and through the board 19 in the left and right directions to the brackets 15. Further, the heat is transferred from the brackets 15 to the heat pipe sidewalls 13b and is then transferred through the inside of the heat pipe and from the heat pipe contacting portion 13a to the heat exchanger 21. The heat exchanger 21 which is cooled be air or liquid, radiates the heat out to the air.

At this time, in the heat pipe 13, the heat transferring medium evaporates at the sidewall 13b and condenses at the contacting portion 13a. The heat transferring medium is circulated through the meandering capillary in the heat pipe 13. This heat transfer associated with the evaporating and condensing of the heating medium is so efficiently carried out that the heat is able to be transferred for a long distance in the heat pipe 13 with a low thermal resistance. In general, the thickness of the heat pipe 13 is about between 0.5 and 15 mm, the diameter of the meandering capillary is about between 0.2 and 10 mm, the pitch of the meandering capillary is about between 0.3 and 20 mm and the thermal resistance is about between 0.01 and 2.0° C./W.

Figure 3:
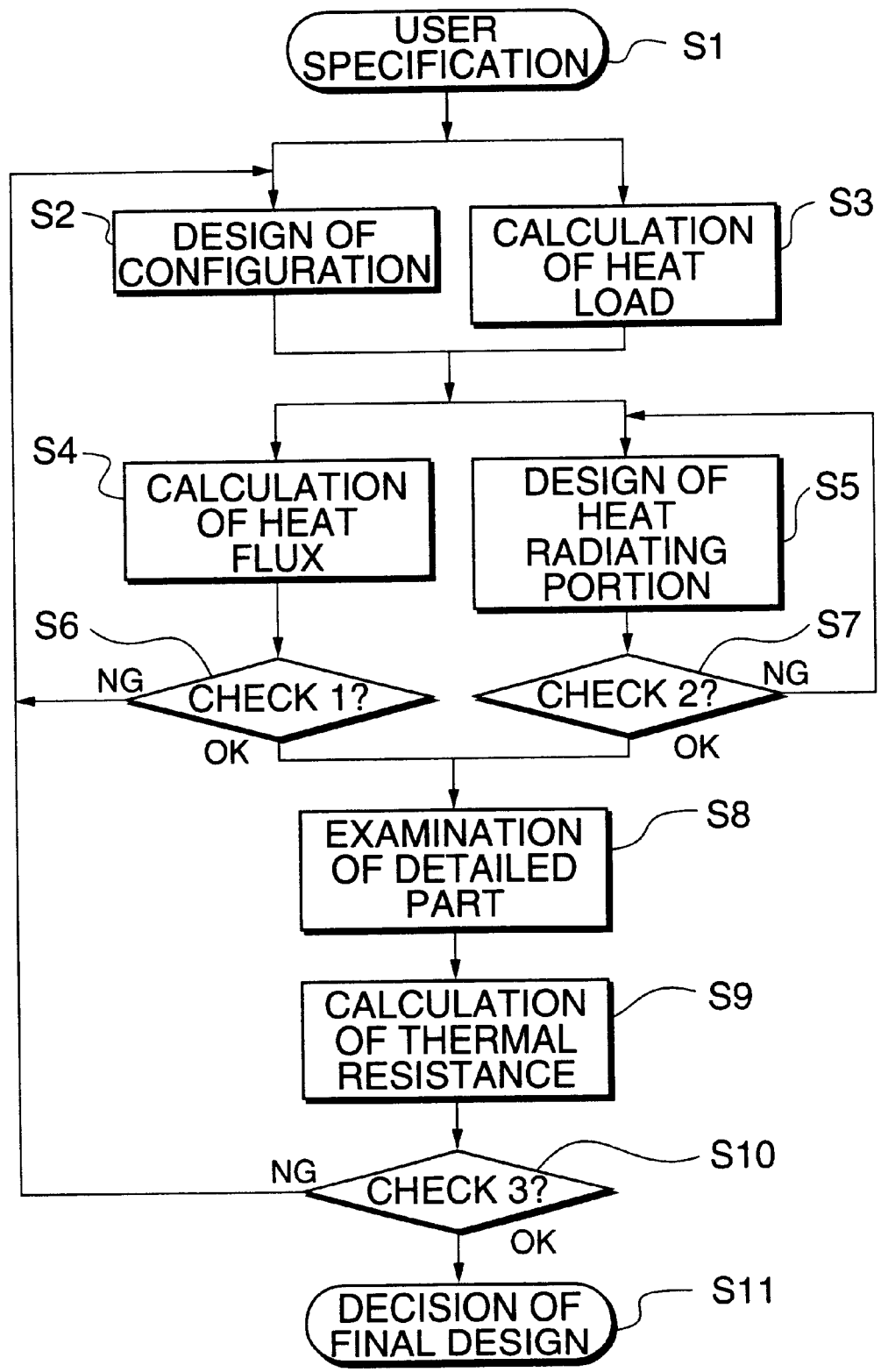
FIG. 3 is a flowchart of the basic design of the electronic component cooling apparatus.

FIG. 3 is a flowchart of the basic design of the electronic component cooling apparatus. First, a user specification is provided (S1). The user specification includes the amount of heat produced by the board, a size of the boards, the number of boards, a size of the electronic component cooling apparatus, a size of the heat radiating portion, amount of cooling air (or water), a temperature of the cooling air and a temperature of the water, and the like.

Based on the user specification, the configuration (the first) of the electronic component cooling apparatus is determined (S2). And, a heat load is calculated (S3). Next, a heat flux is calculated (S4) and the shape of the heat radiating portion, and the like, is designed (S5).

In the check 1 (S6), it is checked whether the heat flux is in the preferred range (above-mentioned) or not. In the case that the check is NG, the flow goes back to S2, and the shape of the electronic component cooling apparatus will be corrected. The design of the heat radiating portion, at the check 2(S7), it is checked whether the design of the heat radiating portion is in the preferred range (above-mentioned) or not. In the case that the check is NG, the flow goes back to S5, and the dimension and shape of the heat radiating portion for the electronic component will be corrected.

In the case that both of the checks of S6 and S7 are OK, next the detailed part of the electronic component cooling apparatus is examined (S8), and the thermal resistance of each of the parts is calculated (S9). Next, it is checked whether the thermal resistance is in the preferred range (above-mentioned) or not (S10). In the case that the check is NG, the flow goes back to S2, and the shape will be redesigned. In the case that the check is OK, the final design will be determined (S11).

Figure 4:
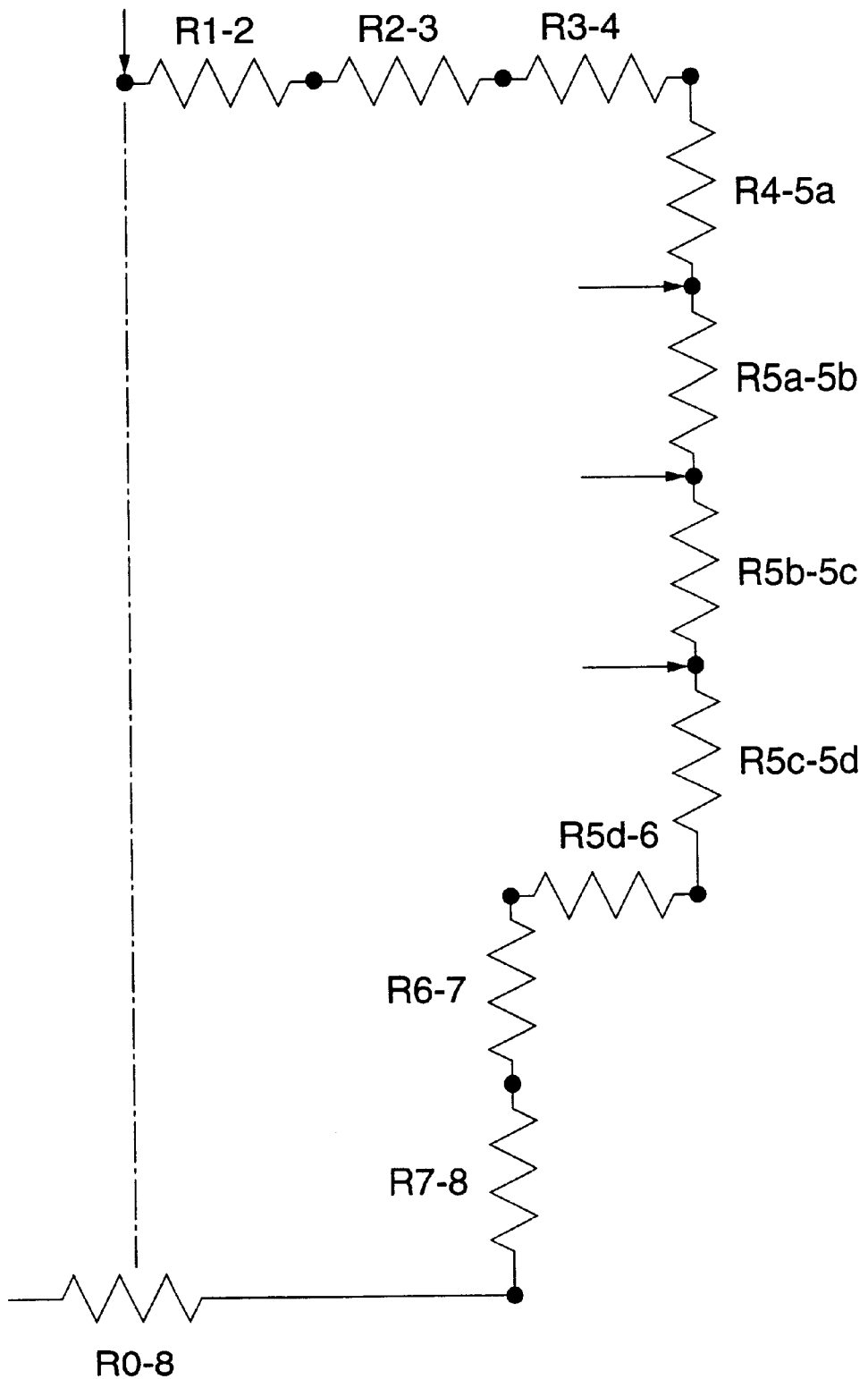
FIG. 4 is a view of a heat transfer model (showing the thermal resistance of each part) of the electronic component cooling apparatus according to one embodiment of the present invention.

FIG. 4 shows a heat transfer model (the thermal resistance of each part) of the electronic component cooling apparatus according to one embodiment of the present invention. The symbols in FIG. 4 are as follows.

R1–2: the thermal resistance between the center and the end of the board;

R2–3: the thermal resistance between the end of the board or the wedge clamp and the bracket;

R3–4: the thermal resistance between the bracket and the sidewall of the heat pipe;

R4–5a: the thermal resistance in the sidewall of the heat pipe;

R5a–5d: the thermal resistance in the sidewall of the heat pipe;

R5d–6: the thermal resistance in the contacting portion of the heat pipe;

R6–7: the thermal resistance between the heat pipe connecting portion and the plate fin type radiator R7–8: the thermal resistance in the plate fin type radiator; and R0–8: the thermal resistance in the cooling air.

Figure 5:
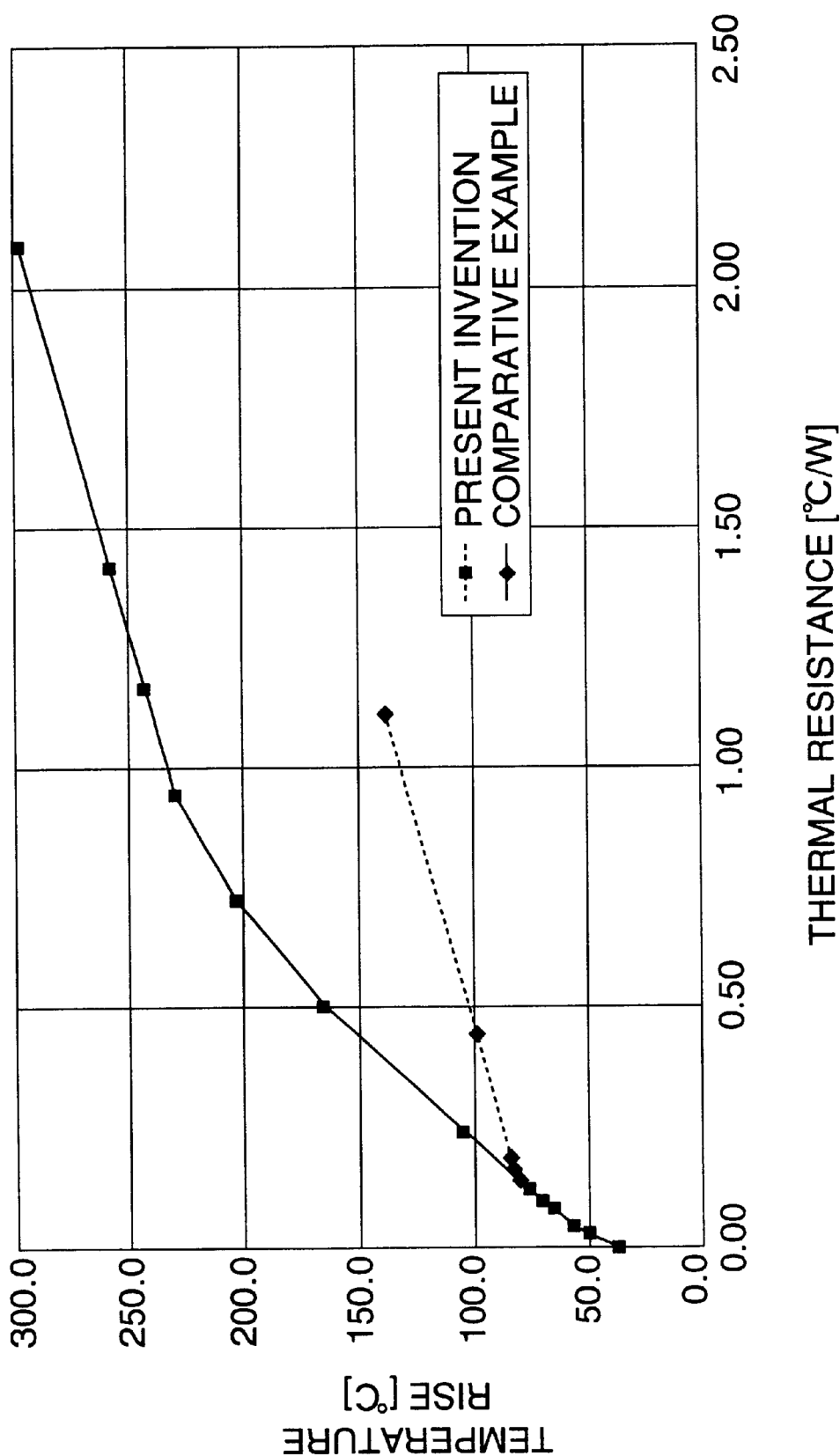
FIG. 5 is a graph of a calculation example of an electronic component cooling apparatus according to one embodiment of the present invention.

FIG. 5 is a graph of a calculation example of the electronic component cooling apparatus according to one embodiment of the present invention. The abscissa shows the thermal resistance (° C./W), and the ordinate shows the temperature rise. The broken line shows the characteristics of the electronic component cooling apparatus according to the present embodiment, and the solid line shows the characteristics of the comparative example. The comparative example is an example of replacing the heat pipe of the embodiment according to the present invention with an aluminum plate.

As shown in FIG. 5, the total thermal resistance (between the center of the board and the cooling air) of the embodiment according to the present invention is low (about 1.1° C./W) and the temperature rise of the board is low (about 40° C.→154° C.; 114° C. rising). On the other hand, in the comparative example, the total thermal resistance is high (about 2.1° C./W) and the temperature rise of the board is high (about 40° C.→295° C.; 255° C. rising). The reason for this is because the thermal resistance in the heat pipe is very low (about 0.1° C./W), but the thermal resistance in the aluminum plate is high (about 0.9° C./W). Thus, by using the electronic component cooling apparatus according to the above-described embodiment of the present invention, the heat transfer efficiency is so improved that the boards or the elements can be sufficiently cooled.

Figure 6:
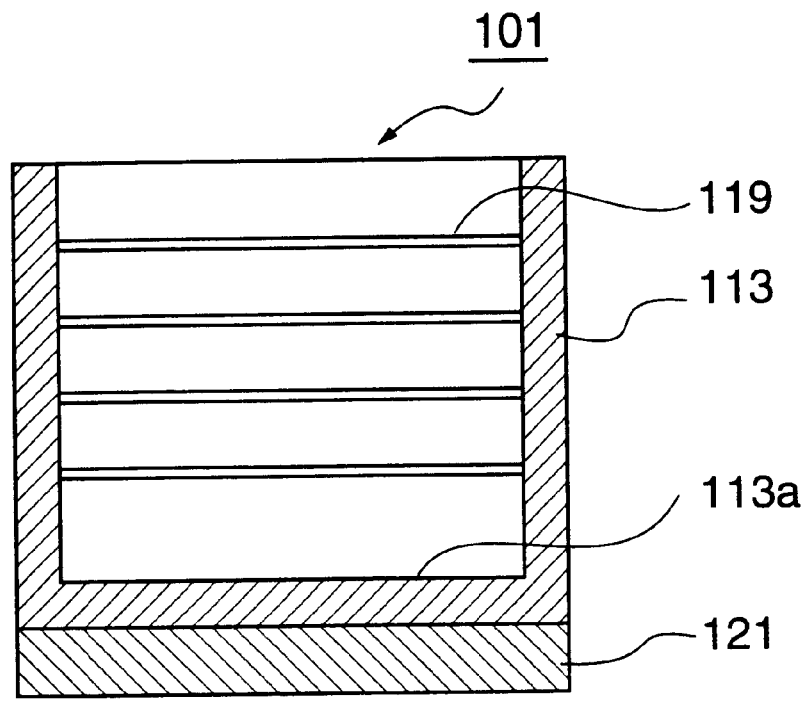
FIG. 6 is a schematic view of an electronic component cooling apparatus according to another embodiment of the present invention.

FIG. 6 is a schematic view of an electronic component cooling apparatus according to another embodiment of the present invention. In this electronic component cooling apparatus 101, the connecting portion 113a of the heat pipe 113 is formed over the full surface of the width direction of the heat exchanger 121. By such a construction, the thermal resistance between the connecting portion 113a and the heat exchanger 121 can be decreased further. The symbol 119 in FIG. 6 shows a printed board.

Figure 7:
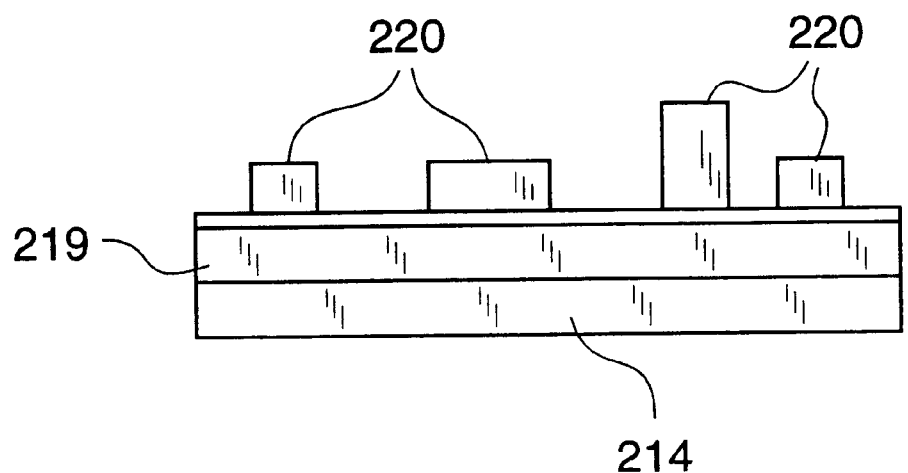
FIG. 7 is a schematic view of an electronic component cooling apparatus according to still another embodiment of the present invention.

FIG. 7 is a schematic view of an electronic component cooling apparatus according to still another embodiment of the present invention.

In this embodiment, over the full undersurface (i.e., a face surface) of a board 219 on which elements (components) 220 are mounted, a plate type heat pipe 214 is attached.

In this case, since the heat produced by the board 219 is removed by the heat pipe 214 which located just under the large face surface board 219, there is no necessity to transfer heat for a long distance through the board 219. Thus, this arrangement provides good coolablity.

Figure 8:
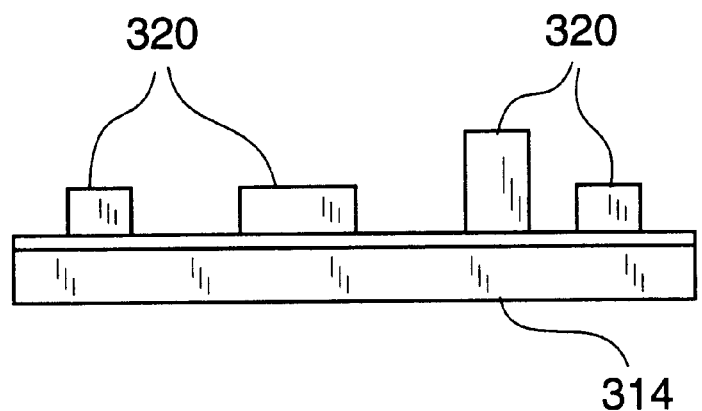
FIG. 8 is a schematic view of another embodiment of the arrangement shown in FIG. 7.

FIG. 8 is a schematic view of another embodiment of the arrangement shown in FIG. 7.

In this embodiment, a board 314 itself is comprised of a heat pipe. In this case, since there is no thermal resistance between the board and the heat pipe, the thermal resistance is further decreased.

Figure 9:
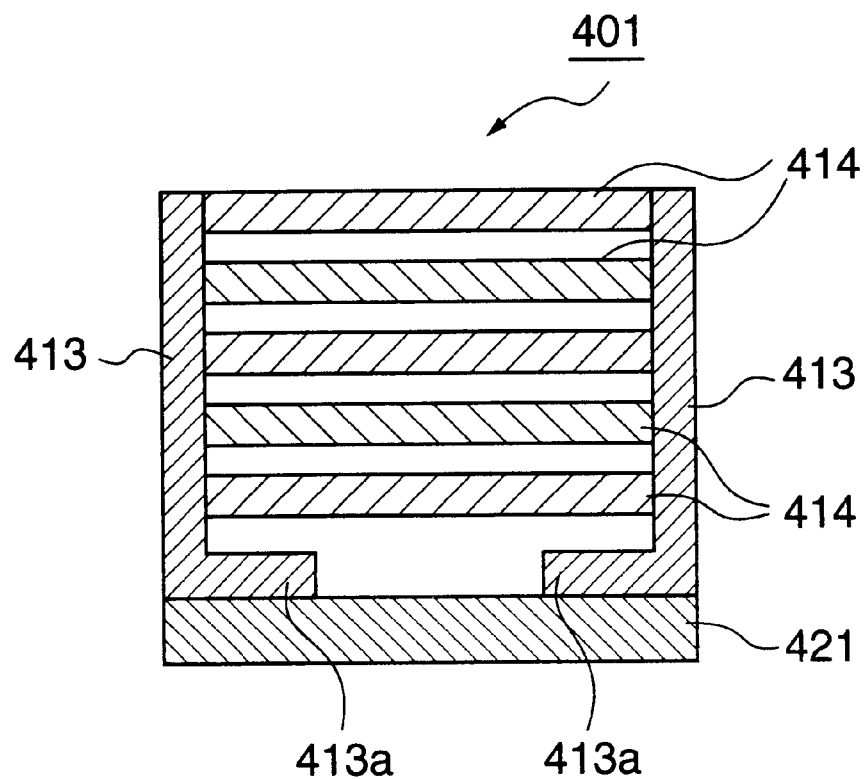
FIG. 9 is a schematic view of still another embodiment of the arrangement shown in FIG. 8.
Figure 10:
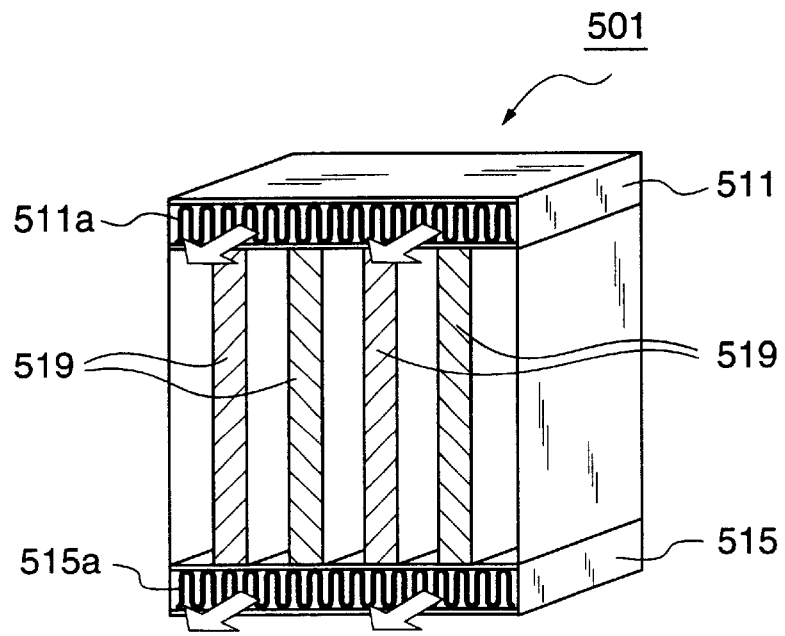
FIG. 10 is a perspective view of a conventional air-cooled electronic component cooling apparatus.
Figure 11:
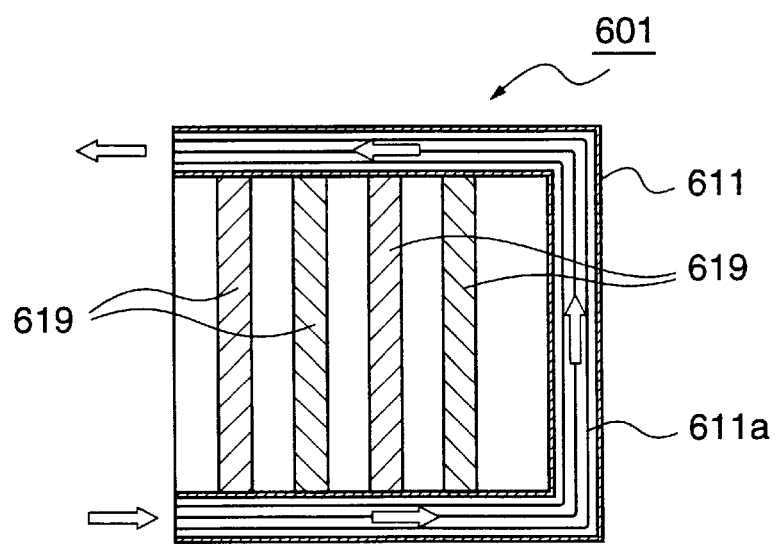
FIG. 11 is a side-sectional view of another conventional water-cooled electronic component cooling apparatus.

FIG. 9 is a schematic view of still another embodiment of the arrangement shown in FIG. 8.

In this embodiment, all of the boards 414 are made of a heat pipe. The heat is transferred through the sidewall 413 of the heat pipe to a plate fin type radiator (heat radiating portion) 421 via connecting portion 413a.

The present invention, as described above, provides an electronic component cooling apparatus which has sufficient coolability, even when the distance between the heat radiating portion of the plate fin type radiator and the like, and the electronic component is great, and also provides improved flexibility in design.

We claims:

1. A cooling apparatus for cooling a plurality of boards having electronic components mounted thereon, the boards being arranged in a row, wherein the apparatus comprises:
   a plate fin type air-cooled or liquid-cooled radiator; and
   a plate type meandering capillary tube heat pipe that transfers heat between end faces of the boards and the radiator;
      wherein the plate type meandering capillary tube heat pipe comprises a first part that is a sidewall of the electronic component cooling apparatus, and a second part that is bent at an end of the sidewall and that is connected along the radiator; and
   wherein:
      (i) the plate type meandering capillary tube heat pipe comprises a capillary that is sealed off from the outside;
      (ii) one part of the capillary acts as a heat radiating portion and another part of the capillary acts as a heat receiving portion;
      (iii) the heat receiving portion and the heat radiating portion are alternately arranged, and the capillary meanders between the heat receiving portion and the heat radiating portion;
      (iv) a two-phase condensable working fluid is sealed inside the capillary; and
      (v) the capillary has a diameter less than a maximum diameter which allows the two-phase condensable working fluid to circulate and move while being sealed inside the capillary.

2. The cooling apparatus according to claim 1, further comprising brackets mounted between the end faces of the boards and the plate type meandering capillary tube heat pipe for securing the boards to the plate type meandering capillary tube heat pipe.

3. The cooling apparatus according to claim 2, wherein the brackets are secured to the plate type meandering capillary tube heat pipe by at least one of a screw and solder.

4. The cooling apparatus according to claim 2, wherein the brackets are secured to the plate type meandering capillary tube heat pipe by both a screw and solder.

5. The cooling apparatus according to claim 1, wherein a thermal resistance at a connection portion between the radiator and the plate type meandering capillary tube heat pipe is between about 0.001° C./W and about 3.00° C./W, and a heat flux is between about 0.01 W/cm$^2$ and about 30 W/cm$^2$.

6. The cooling apparatus according to claim 1, wherein a thermal resistance at a contacting surface between the end faces of the boards and the plate type meandering capillary tube heat pipe is between about 0.001° C./W and about 3.00° C./W, and a heat flux is between about 0.01 W/cm$^2$ and about 30 W/cm$^2$.

7. The cooling apparatus according to claim 1, wherein:
   the plate type meandering capillary tube heat pipe is secured to the radiator by a screw;
   a threaded screw hole is formed in a lock insert which is mounted in the radiator.

8. A cooling apparatus for an electronic component mounted on a board, comprising:
   an air-cooled or liquid-cooled heat radiator; and
   a meandering capillary tube heat pipe arranged to transfer heat between the board and the radiator;
      wherein the meandering capillary tube heat pipe is attached to the board along a face surface of the board; and
   wherein:
      (i) the meandering capillary tube heat pipe comprises a capillary that is sealed off from the outside;
      (ii) one part of the capillary acts as a heat radiating portion and another part of the capillary acts as a heat receiving portion;
      (iii) the heat receiving portion and the heat radiating portion are alternately arranged, and the capillary meanders between the heat receiving portion and the heat radiating portion;
      (iv) a two-phase condensable working fluid is sealed inside the capillary; and
      (v) the capillary has a diameter less than a maximum diameter which allows the two-phase condensable working fluid to circulate and move while being sealed inside the capillary.

9. A cooling apparatus for an electronic component or a board on which the electronic component is mounted, the apparatus comprising:
   an air-cooled or liquid-cooled heat radiator; and
   a meandering capillary tube heat pipe arranged to transfer heat between: (a) the electronic component or the board, and (b) the heat radiator;
   wherein:
      (i) the meandering capillary tube heat pipe comprises a capillary that is sealed off from the outside;
      (ii) one part of the capillary acts as a heat radiating portion and another part of the capillary acts as a heat receiving portion;
      (iii) the heat receiving portion and the heat radiating portion are alternately arranged, and the capillary meanders between the heat receiving portion and the heat radiating portion;
      (iv) a two-phase condensable working fluid is sealed inside the capillary; and
      (v) the capillary has a diameter less than a maximum diameter which allows the two-phase condensable working fluid to circulate and move while being sealed inside the capillary.

10. The cooling apparatus according to claim 9, wherein:
    the heat radiator comprises a set of radiation fins, and has an outer-shape of a substantially flat plate; and
    the meandering capillary tube heat pipe is a plate type heat pipe having an outer-shape of a substantially flat plate, and is connected along the heat radiator.

11. The cooling apparatus according to claim 10, wherein a thermal resistance at a connecting portion between the heat radiator and the meandering capillary tube heat pipe is between about 0.001° C./W and about 3.00° C./W, and a heat flux is between about 0.01 W/cm$^2$ and about 30 W/cm$^2$.

12. The cooling apparatus according to claim 10, wherein a thermal resistance at a contacting surface between an end surface of the board on which the electronic component is mounted and the meandering capillary tube heat pipe is between about 0.001° C./W and about 3.00° C./W, and a heat flux is between about 0.01 W/cm$^2$ and about 30 W/cm$^2$.

13. The cooling apparatus according to claim 10, wherein:
    the meandering capillary tube heat pipe is secured to the heat radiator by a screw;
    a threaded screw hole is formed in a lock insert which is mounted in the heat radiator.

* * * * *